(12) United States Patent
Lyons et al.

(10) Patent No.: US 6,635,409 B1
(45) Date of Patent: Oct. 21, 2003

(54) METHOD OF STRENGTHENING PHOTORESIST TO PREVENT PATTERN COLLAPSE

(75) Inventors: Christopher F. Lyons, Fremont, CA (US); Scott A. Bell, San Jose, CA (US); Todd Lukanc, San Jose, CA (US); Marina V. Plat, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 182 days.

(21) Appl. No.: 09/902,568

(22) Filed: Jul. 12, 2001

(51) Int. Cl.[7] .............................. G03F 7/00; G03F 7/26
(52) U.S. Cl. ...................... 430/313; 430/311; 430/314; 430/317; 430/322; 430/328; 430/330; 430/394
(58) Field of Search ................................ 430/311, 313, 430/314, 317, 322, 328, 330, 394

(56) References Cited

U.S. PATENT DOCUMENTS

| | | | |
|---|---|---|---|
| 4,212,935 A | * 7/1980 | Canavello et al. ......... 430/326 |
| 4,517,227 A | 5/1985 | Cassat ...................... 427/96 |
| 4,732,173 A | 3/1988 | Czaja et al. ............... 134/72 |
| 5,128,230 A | 7/1992 | Templeton et al. ........ 430/191 |
| 5,240,878 A | * 8/1993 | Fitzsimmons et al. ..... 438/670 |
| 5,326,672 A | 7/1994 | Tanaka et al. ............ 430/322 |
| 5,374,502 A | 12/1994 | Tanaka et al. ............ 430/322 |
| 5,374,693 A | 12/1994 | Lynch et al. .............. 525/501 |
| 5,474,877 A | * 12/1995 | Suzuki ...................... 430/325 |
| 5,681,487 A | * 10/1997 | Seki et al. ................. 216/94 |
| 5,930,549 A | 7/1999 | Kim et al. ................. 394/611 |
| 5,968,712 A | 10/1999 | Thackeray et al. ........ 430/326 |
| 6,048,672 A | 4/2000 | Cameron et al. .......... 430/327 |
| 6,051,358 A | 4/2000 | Zampini et al. ........... 430/192 |
| 6,150,073 A | * 11/2000 | Huang ....................... 430/313 |
| 6,180,512 B1 | 1/2001 | Dai ........................... 438/627 |
| 6,232,417 B1 | 5/2001 | Rhodes et al. ............ 526/171 |
| 6,248,177 B1 | 6/2001 | Halbmeier ................. 134/2 |
| 2001/0035355 A1 | 11/2001 | Kamijima .................. 205/118 |
| 2003/0003402 A1 | * 1/2003 | Plat ........................... 430/313 |

FOREIGN PATENT DOCUMENTS

| | | | |
|---|---|---|---|
| JP | 06-224115 | * 8/1994 | ......... H01L/21/027 |
| JP | 10-333534 | * 12/1998 | ............. G03F/1/04 |
| JP | 2000-89477 | * 3/2000 | ............. G03F/7/40 |

OTHER PUBLICATIONS

Pattern Collapse in the Top Surface Imaging Process After Dry Development, Shigeyasu Mori, et al, J. Vac. Sci. Technol. B 16(6), Nov./Dec. 1998.

Toshihiko Tanaka et al.: "Prevention of Resist Pattern Collapse by Flood Exposure During Rinse Process," Japanese Journal of Applied Physics, Dec. 15, 1994, pp. 1803–1805, vol. 33, No. 12B, Tokyo.

John C. Matthews et al., "Stabilization of single layer and multilayer resist patterns to aluminum etching environments.", Proceedings of SPIE—The International Society for Optical Engineering, vol. 470, Optical Microlithography III: Technology for the Next Decade (1984), pp. 194–202.

T.R. Pampalone, "Novolac Resins Used in Positive Resist Systems.", Solid State Technology, Jun. 1984, pp. 115–119.

* cited by examiner

Primary Examiner—Mark F. Huff
Assistant Examiner—Nicole Barreca
(74) Attorney, Agent, or Firm—Foley & Lardner (57) ABSTRACT

There is provided a method for forming a photoresist layer for photolithographic applications which has increased structural strength. The photoresist layer is exposed through a mask and developed. The photoresist layer is then treated to change its material properties before the photoresist layer is dried. Also provided are a semiconductor fabrication method employing a treated photoresist and a composition for a treatable photoresist.

19 Claims, 8 Drawing Sheets

METHOD OF STRENGTHENING PHOTORESIST TO PREVENT PATTERN COLLAPSE

BACKGROUND OF THE INVENTION

This invention is related generally to a method of making a semiconductor device and specifically to photolithographic methods for forming submicron features including an added process step to harden photoresist material to prevent pattern collapse.

The semiconductor industry has progressively reduced the size of components and connectors on integrated circuits in the pursuit of increased computational power and device speed. State of the art semiconductor devices are approaching the limit of feature sizes that may be formed using conventional photolithography fabrication methods. One of the limits being approached involves the minimum dimension of photoresist structures that can be used during fabrication.

Photolithography employs photoresist to create a patterned structure that protects the underlying surface from subsequent fabrication steps, such as chemical etching. There are two types of photoresists in common use, positive photoresists and negative photoresists. Positive photoresists are sensitized when exposed to ultraviolet light so that exposed areas will dissolve in a developer solution leaving behind unexposed areas. Negative photoresists are hardened by exposure to ultraviolet light so exposed areas are inhibited from being dissolved by the developer solution while unexposed areas are dissolved.

Figure 1A:
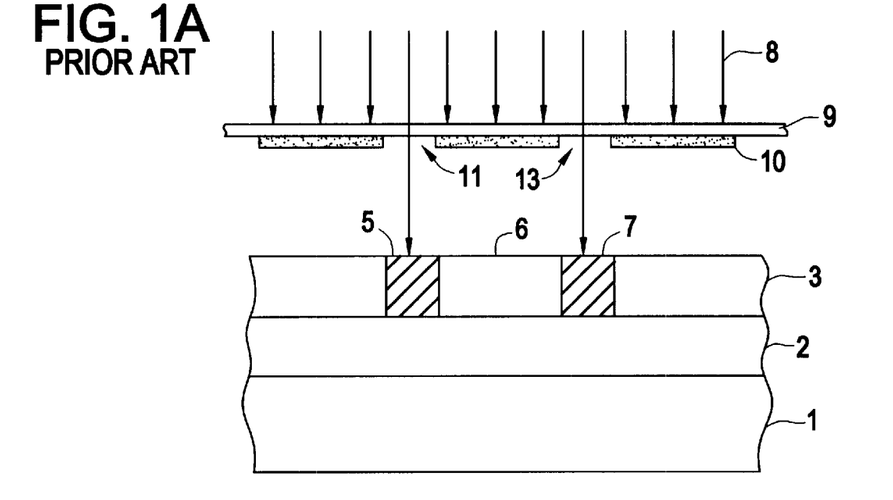
FIGS. 1A, 1B and 1C are side cross sectional views of a conventional method of making semiconductor narrow lines.
Figure 1B:
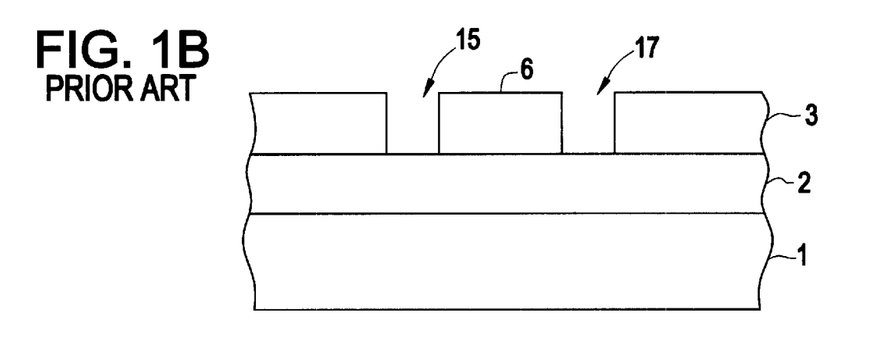
Figure 1C:
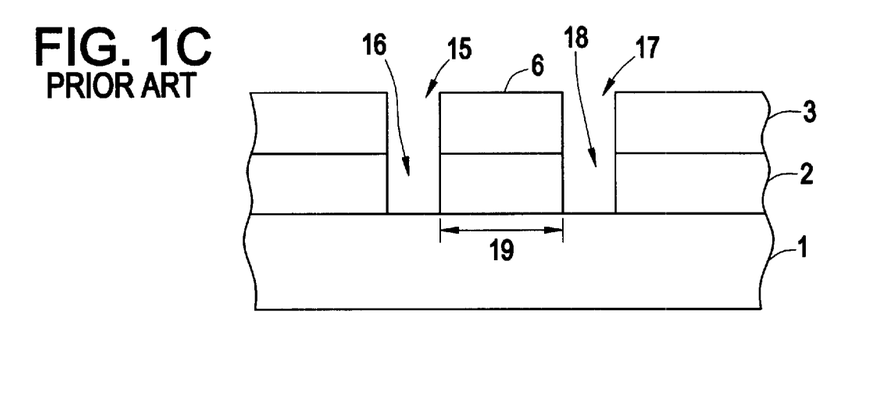

Using the example of a positive photoresist process, a conventional photolithography method for producing narrow lines is illustrated in FIGS. 1A and 1B. Supported by a substrate 1 is provided a material layer that forms a surface 2 in which it is desired to form a first and second narrow line. A photoresist layer 3 is formed over the surface 2. A first region 5 and a second region 7 in the photoresist layer 3 are simultaneously exposed to electromagnetic radiation 8, such as ultraviolet or actinic light, through openings 11 and 13 in a mask or reticle 9, as illustrated in FIG. 1A. The mask 9 comprises a pattern of lines and spots of opaque material 10, which prevent transmission of light 8, and transparent openings 11, 13. The terms mask and reticle are used interchangeably in the semiconductor arts, with the term reticle often referring to a mask used in step and repeat exposure systems. The photoresist layer 3 is then developed wherein the exposed regions 5 and 7 are removed (when employing a negative photoresist, the unexposed areas are removed), while the unexposed region 6 remains, as illustrated in FIG. 1B. A gas or liquid etching medium is then permitted to reach the underlying surface 2 through the openings 15, 17 in the photoresist layer 3 to etch narrow lines 16, 18 in surface 2, which are separated by an inter-lines distance 19, as illustrated in FIG. 1C.

In the developing step, the exposed areas of a positive photoresist are removed by a developer solution to leave the desired pattern image on the surface. At the end of the developing step, the surface must be rinsed to stop the developing reaction and remove the developer solution from the surface. Typical positive photoresist developer solutions are alkaline solutions diluted with water, which require only a water rinse. Negative photoresist developer solutions are organic solvents, which require rinsing with other organic solvents (e.g. n-butlyl acetate). After rinsing, the substrate is dried in preparation for further processing.

Developed, rinsed and dried photoresist layers are sometimes then treated with ultraviolet radiation to reduce the tendency of the photoresist to flow during subsequent process steps where the photoresist will experience high temperatures which may including bake cycles, plasma etching, ion implantation and ion milling. This treatment is typically accomplished by irradiating the dried photoresist layer with deep UV (e.g. <320 nm) while heating the layer to a high temperature (e.g. 120–190° C.) for approximately a minute.

Figure 2A:
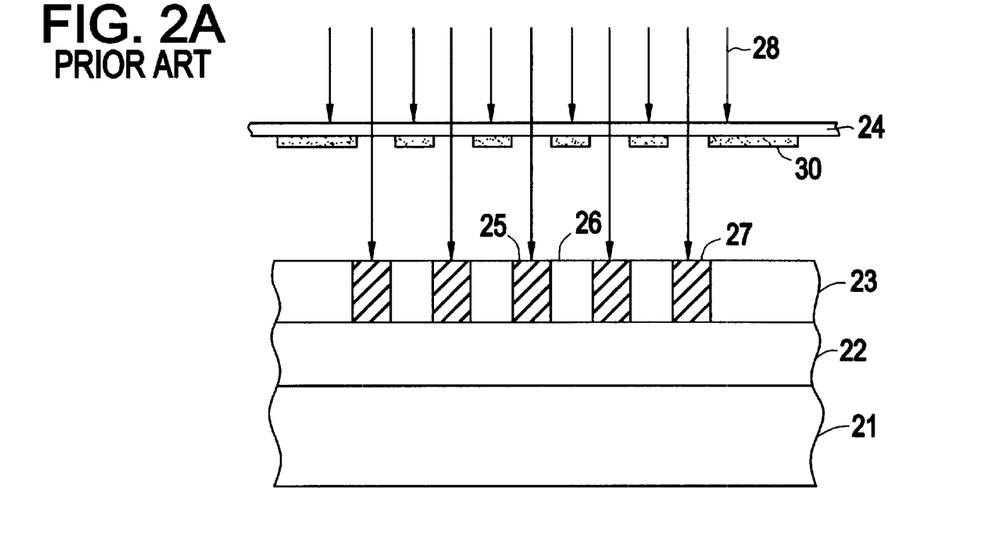
FIGS. 2A, 2B and 2C are a side cross sectional view of a conventional method of making semiconductor narrow lines where the narrow lines are closely spaced.
Figure 2B:
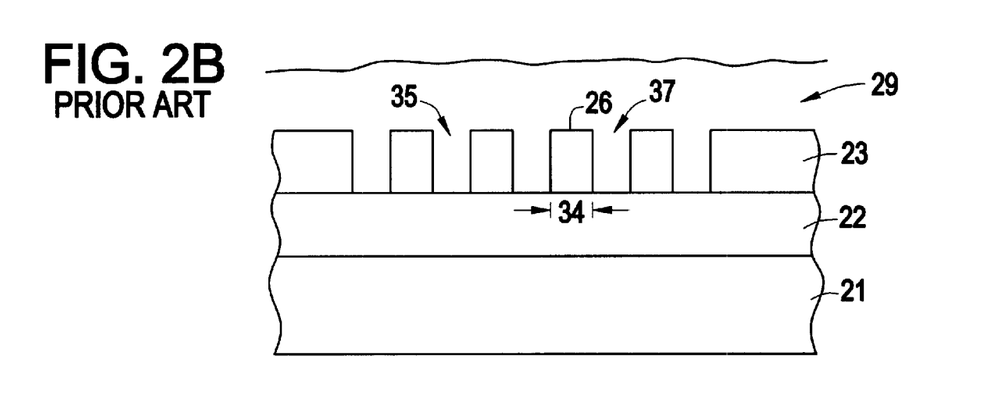
Figure 2C:
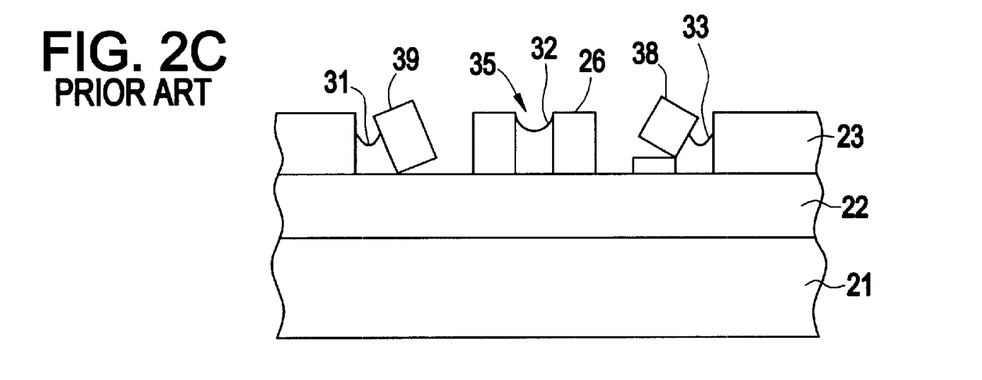

As the width and spacing of narrow lines is reduced, the width of the photoresist structures used to create the narrow lines must be reduced. A practical limit being approached in semiconductor feature sizes results from the photoresist structures becoming so thin in the width direction, e.g. inter-lines distance 19 in FIG. 1C, with respect to the photoresist layer thickness that they lack the structural rigidity to withstand the forces induced by surface tension of liquid between them when the surface is dried. Referring to FIG. 2A, on top of a substrate 21 a material layer is provided that forms a surface 22 in which it is desired to form a first and second narrow line. A positive photoresist layer 23 is formed over the surface 22, which is exposed to electromagnetic radiation 28, such as ultraviolet or actinic light, through openings in opaque material 30 on a mask or reticle 24. The photoresist layer 23 is then developed with a solution 29 wherein the exposed regions 25 and 27 are removed (when employing a negative photoresist, the unexposed areas are removed), while the unexposed region 26 remains. As shown in FIG. 2A, as feature sizes are reduced, the spacings between opaque regions 30 on the mask 24 are reduced, which results in exposed regions 25, 27, that are illuminated by light 28, and unexposed regions 26 both having narrow widths. When developed, the photoresist features 26 are thin to provide a narrow inter-lines distance 34, and are closely spaced to make the photoresist openings 35, 37 narrow, as illustrated in FIGS. 2A and 2B. As illustrated in FIG. 2C, as the photoresist pattern layer dries, a meniscus 31, 32, 33 of developer or rinse solution forms in the narrow lines 35, 37 between adjacent photoresist structures 26, 38, 39, which pulls the structures together due to surface tension. Thin structures of relatively weak photoresist material can collapse under such meniscus forces, as illustrated by photoresist structures 38 and 39, which renders the pattern on the surface unusable. Furthermore, thin photoresist structures may collapse under capillary forces of the liquid within narrow lines during spin developing or spin rinsing, which involves rapidly revolving a wafer while depositing a solution on the wafer near the axis of revolution so the solution is distributed over the wafer by centrifugal force. Thus, the prior art methods of photolithography cannot form structures below a critical inter-lines dimension which is limited by the mechanical strength of the photoresist.

BRIEF SUMMARY OF THE INVENTION

According to one aspect of the present invention, there is provided a method of forming a photoresist layer, comprising providing a surface, depositing a photoresist layer on the surface, the photoresist layer having material properties, exposing the photoresist layer through a mask, developing the photoresist layer, and treating the photoresist layer while the photoresist layer is immersed in a liquid to change the photoresist layer's material properties.

According to another aspect of the present invention, there is provided a method of making a semiconductor device, comprising forming at least one semiconductor device on a substrate, forming an insulating layer over the semiconductor device, forming a photoresist layer over the insulating layer, the photoresist layer having material properties, exposing the photoresist layer through a mask, developing the photoresist layer to form an opening in the photoresist layer, treating the photoresist layer while the photoresist material is immersed in a liquid to change the photoresists layer's material properties, forming a narrow line in the insulating layer, and forming a conductive layer in the narrow line.

According to another aspect of the present invention, there is provided a semiconductor device made by using the methods described herein.

According to another aspect of the present invention, there is provided a composition for a photoresist consisting essentially of a matrix material, a sensitizer material, a solvent material, and a cross-linkable material.

DETAILED DESCRIPTION OF THE PREFERRED EMBODIMENTS

The present inventors have realized that line density may be increased and the inter-lines spacing may be reduced if photoresist patterns are hardened after being developed. By incorporating a cross-linkable material in the photoresist and performing a material hardening step after developing but before the substrate is dried, photoresist features can be made strong enough to prevent deformation or collapse by liquid surface tension forces.

The problem of photoresist pattern collapse can be reduced or avoided, so that pattern dimensions can be reduced beyond current state of the art, by changing the photoresist material properties to increase its strength. However, simply increasing the strength of the photoresist would negatively impact its flow, wetting and developing properties. This problem can be reduced or avoided by modifying the photoresist materials to include cross-linkable groups in its composition and adding a material treatment step to activate those cross-linkable groups while the material is immersed in the developer or rinse solutions. In this manner, the favorable handling and processing properties of current photoresist compositions can be retained, while achieving the high strength of developed photoresist that is desired to prevent pattern collapse in high density semiconductor fabrication.

Positive photoresists are typically three-component materials, consisting of a matrix material, a photo-activated sensitizer material and a solvent. Typically, the matrix component of positive photoresists is a low-molecular weight novolac resin that provides the photoresist layer's mechanical properties. Normally novalac resin will dissolve in an aqueous base, but the sensitizer component inhibits dissolution. Typical positive photoresist sensitizers, which are also known as photoactive compounds, are diazonaphthaquinones. When exposed to actinic light, a photochemical transformation occurs that turns the photosensitive sensitizer component from a dissolution inhibitor to a dissolution enhancer. The solvent component suspends the matrix and sensitizer in a flowable liquid until the photoresist layer is cured with a soft-bake prior to being exposed to actinic light. Typical positive photoresist solvent systems are mixtures of n-butyl acetate, xylene and cellosolve aetate.

Negative photoresists are also three-component materials, consisting of a matrix component, a sensitizer component and a solvent. Typically, the negative photoresist matrix component is a cyclized synthetic rubber resin that is soluble in non-polar organic solvents such as toluene and xylene. Negative photoresist sensitizer components react photochemically to generate a cross-linked three-dimensional molecular network that is insoluble in the developer solution. The typical negative photoresist sensitizer is a bisarylazide. Typically, the solvent component is an aromatic liquid.

In a preferred embodiment, photoresist materials are improved by incorporating a fourth component that is capable of forming cross-linked molecular structures when subjected to a particular process treatment, such as ultraviolet light irradiation and/or heating to a particular temperature range. When given the appropriate process treatment, this component will established cross-linked structures throughout the photoresist matrix material that will increase the tensile and compressive strength of the composition. The result is a photoresist that retains current process properties but that can be transformed into a harder and stronger solid material in a simple treatment step.

Suitable cross-linkable components can be induced to form cross-links by exposure to ultraviolet light or by exposure to temperatures above for a period of time. In some formulations, a combination of exposure to ultraviolet light and to heat may be used to initiate and accelerate cross-linking of the cross-linkable component.

Figure 3A:
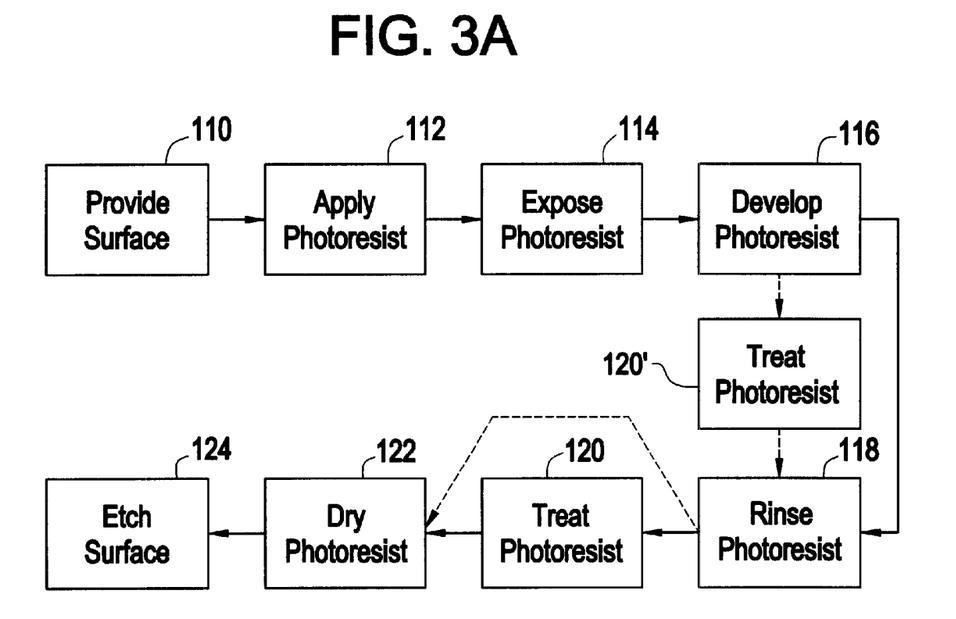
FIGS. 3A and 3B are process block diagrams of methods of making a photoresist layer.

In a preferred embodiment method diagrammed in FIG. 3A, a four-component positive photoresist composition (i.e. including a cross-linkable group as the fourth component) is employed in a semiconductor fabrication process. Among the sequence of steps required to fabricate a finished semiconductor or integrated circuit are the steps of:

providing (step 110) a surface to be photolithographically processed, which may involve preparing the surface with a dehydration bake and priming the surface with a pre-resist coating;

applying (step 112) a layer of the positive photoresist to the surface, which may involve depositing the photoresist on the surface, such as by spin coating or vapor coating to form a uniform, adherent and defect free polymer film of the desired thickness, and performing a soft-bake to drive off the solvent component;

exposing (step 114) the photoresist to actinic or suitable ultraviolet light shown through a mask so only selected areas (the pattern) are illuminated;

developing (step 116) the photoresist, such as by immersing the surface in a bath of developer solution, such as an alkaline aqueous solution, to remove exposed areas of photoresist;

rinsing (step 118) the photoresist layer with an aqueous solution (e.g. water) to stop the developing action and clean the developer solution from the surface, this step being conducted without letting the surface dry between the developing and rinsing steps;

treating (step 120) the photoresist layer while the photoresist layer is immersed in the rinse solution to change its mechanical properties before drying, such as illuminating it with ultraviolet radiation of a particular wavelength and/or heating the layer to a particular temperature range for a particular duration based upon the particular cross-linkable component in the photoresist, to cross-link and harden the unexposed areas of photoresist;

drying (step 122) the photoresist layer; and continuing on with subsequent semiconductor fabrication steps 124, such as etching the surface to form a narrow line in the open areas in the photoresist, adding layers of insulator or conductor material, and removing the photoresist.

Alternatively, in an embodiment wherein the photoresist is treated while immersed in the developing solution before rinsing the process illustrated in FIG. 3A would proceed from developing (step 116) to treating (step 120') to rinsing (step 118) to drying (step 122), as illustrated in the dashed path.

Figure 3B:
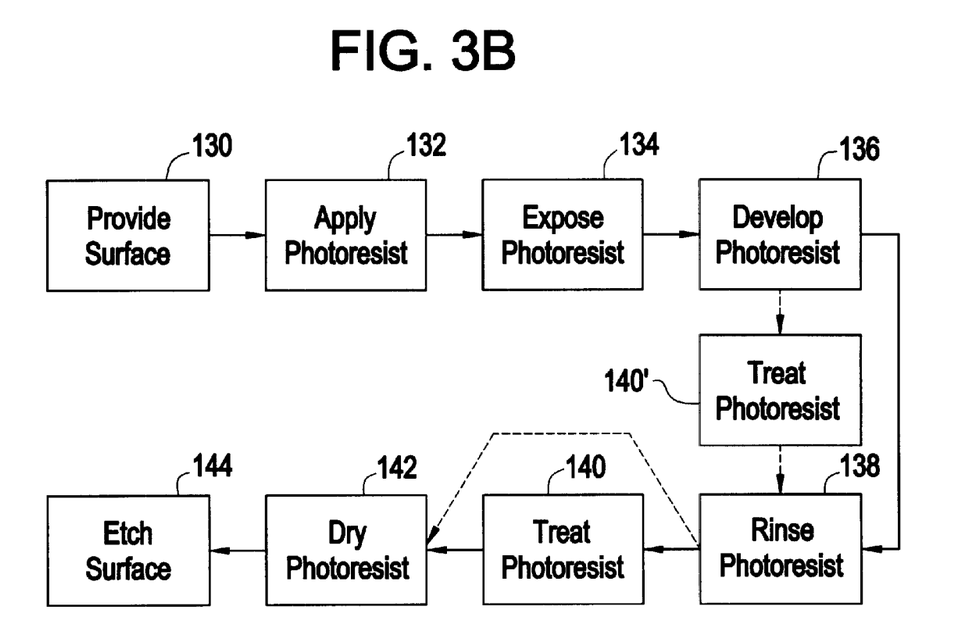

In another preferred embodiment method diagrammed in FIG. 3B, a four-component negative photoresist composition (i.e. including a cross-linkable group as the fourth component) is employed in a semiconductor fabrication process method. Among the sequence of steps required to fabricate a finished semiconductor or integrated circuit are the steps:

providing (step 130) a surface to be photolithographically processed, which may involve preparing the surface with a dehydration bake and priming the surface with a pre-resist coating;

applying (step 132) a layer of the negative photoresist to the surface, which may involve depositing the photoresist on the surface, such as by spin coating or vapor coating to form a uniform, adherent and defect free polymer film of the desired thickness, and performing a soft-bake to drive off the solvent component;

exposing (step 134) the photoresist to actinic light shown through a mask so only selected areas (the pattern) are illuminated;

developing (step 136) the photoresist, such as by immersing it in a bath of developer solution, such as a mixture of one or both of toluene and xylene, to remove unexposed areas of photoresist;

rinsing (step 138) the photoresist layer with an organic solvent to stop the developing action and clean the developer solution from the surface, this step being conducted without letting the surface dry between the developing and rinsing steps;

treating (step 140) the photoresist layer while the photoresist layer is immersed in the rinse solution to change its mechanical properties before drying, such as illuminating it with ultraviolet radiation of a particular wavelength and/or heating the layer to a particular temperature range for a particular duration selected based upon the particular cross-linkable component in the photoresist;

drying (step 142) the photoresist layer; and continuing on with subsequent semiconductor fabrication steps 144, such as etching the surface to form a narrow line in the open areas in the photoresist, adding layers of insulator or conductor material, and removing the photoresist.

Alternatively, in an embodiment wherein the photoresist is treated while immersed in the developing solution before rinsing the process illustrated in FIG. 3B would proceed from developing (step 136) to treating (step 140') to rinsing (step 138) to drying (step 142), as illustrated in the dashed path.

For the embodiments wherein the photoresist layer is treated with ultraviolet radiation in treatment steps 120, 120', 140 and 140', the irradiation treatment may be accomplished by matching the wavelength of the light source to the wavelength sensitivity of the cross-linkable component of the photoresist. This irradiation treatment wavelength maybe the same as or different from the wavelength of light used to expose the photoresist, i.e. the same as or different from the wavelength sensitivity of the sensitizer component of the photoresist.

Figure 4A:
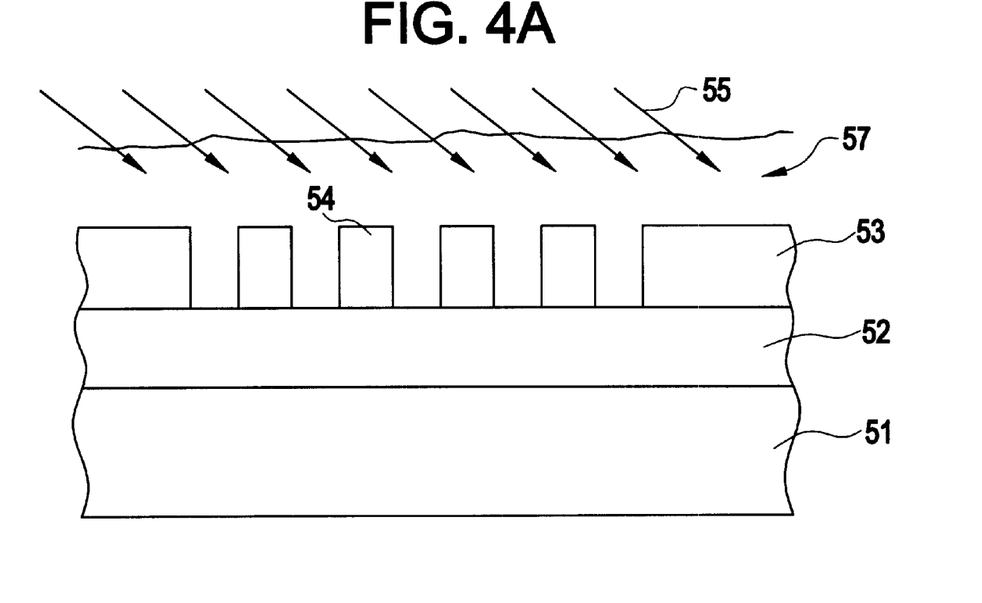
FIGS. 4A, 4B, 4C and 4D are side cross sectional views of methods of treating a hardened photoresist layer.

In a preferred embodiment illustrated in FIG. 4A, ultraviolet light 55 is irradiated through the rinse solution 57 and onto the developed photoresist 53, initiating cross-linking reactions within the photoresist structures 54. In the embodiment wherein the irradiation treatment step is accomplished while immersed in the developer solution, as illustrated in step 140' in FIG. 3B, the ultraviolet light is irradiated through the developer solution in a manner similar to that shown in FIG. 4A.

In another preferred embodiment, the wavelength sensitivity of the cross-linkable component is at a shorter (i.e. higher energy) or longer (i.e. lower energy) wavelength than is the wavelength sensitivity of the sensitizer component such that the step of selectively exposing (which activates the sensitizer) the photoresist layer through the mask is accomplished at a first wavelength and the step of non-selectively treating (which strengthens) the photoresist is accomplished at a second wavelength, so neither irradiation step causes undesired chemical reactions. In a preferred embodiment, the cross-linkable component reacts to form cross-links only when exposed to deep ultraviolet (i.e. very high energy) light, while the sensitizer reacts to longer wavelength ultraviolet light. This embodiment ensures that the ultraviolet light used during the exposing step does not induce the cross-linker component to form cross-links before the developing step, a distinct advantage for a positive photoresist chemistry.

Figure 4B:
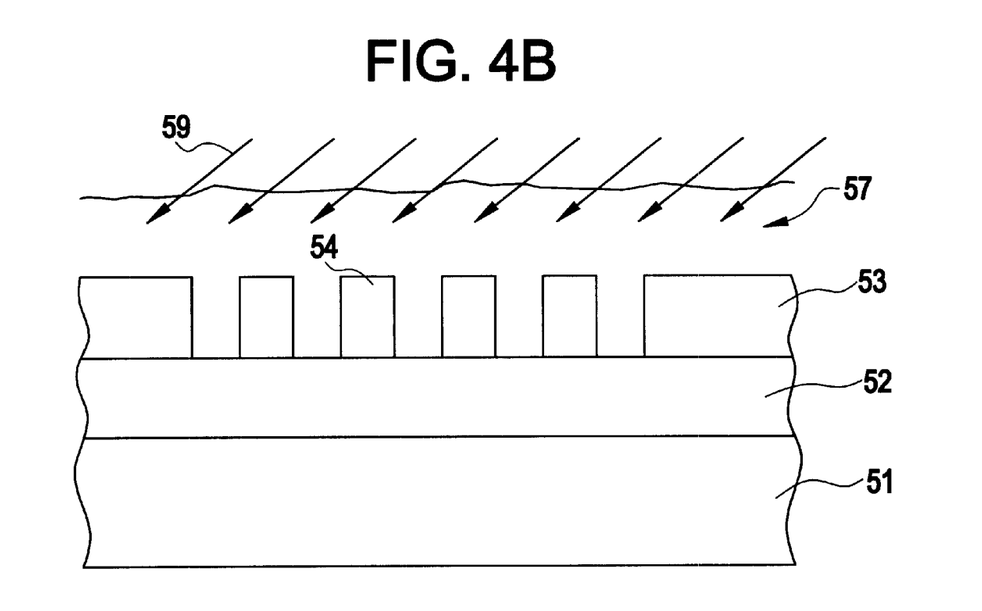

Treating the photoresist layer with heat may be accomplished a number of ways, characterized by the heat transfer mechanisms of radiation, conduction and convection. In one preferred embodiment illustrated in FIG. 4B, the photoresist layer 53 may be heated directly by illuminating it through the rinse solution 57 with infrared light 59 of a particular intensity for a controlled period of time to achieve a desired temperature rise.

Figure 4C:
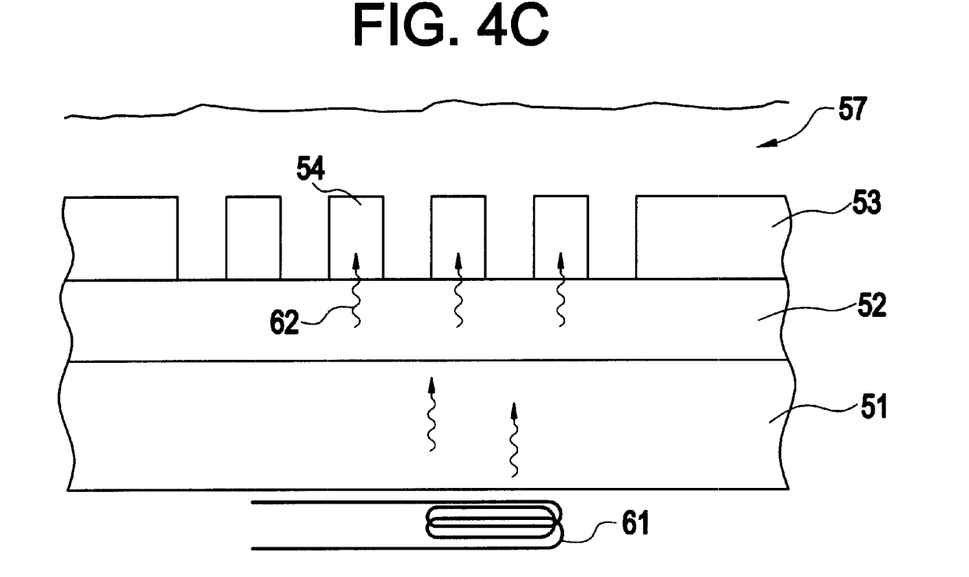

In an alternative embodiment illustrated in FIG. 4C, the substrate 51 maybe heated from underneath, such as with an electric resistive heater 61, so the heat energy 62 conducts through the substrate 51 and layer 52 into the photoresist material 53.

Figure 4D:
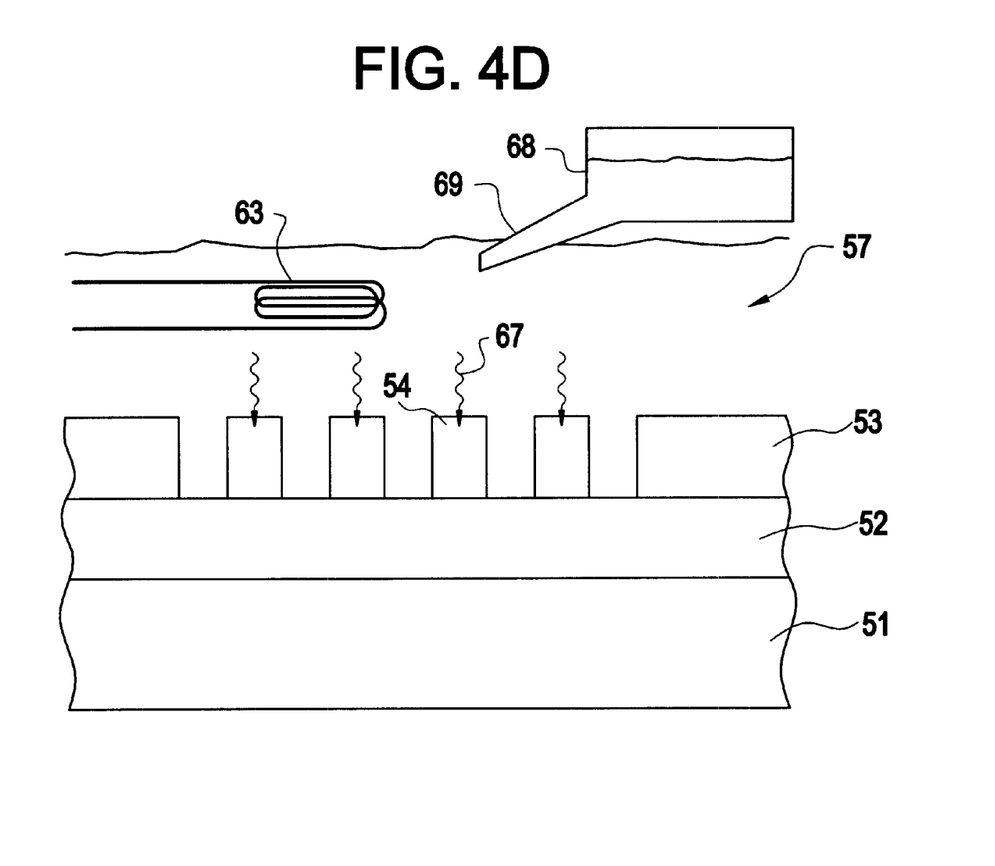

In yet another embodiment as illustrated in FIG. 4D, the rinse solution 57 (or alternatively the developer solution) may be heated, such as with a resistive heater 63, so the heat energy 67 is transferred into the photoresist 54 by convection.

In each of these embodiments it may be preferable to include a means for replenishing liquid that evaporates during the heat treatment to ensure the photoresist pattern is not uncovered until the material has sufficiently hardened to withstand the surface tension forces of a meniscus or capillary formed between adjacent photoresist structures. For this purpose, a rinse reservoir 68 and nozzle 69 may be provided as illustrated in FIG. 4D.

Treatment of the photoresist layer may be accomplished while the layer is submerged within a bath of liquid, such as rinsing solution or developer solution. Alternatively, the photoresist layer may simply be wet during treatment such that the photoresist layer is immersed within a film of liquid, such as rinsing solution or developer solution, that just covers the photoresist layer. A thin layer immersion will be achieved in a spin coating process, such as spin developing or spin rinsing. The term "immersed" in this application applies equally to fully submerged and to wetted with a liquid film sufficient to cover the area of the photoresist being treated. For example, removing a photoresist-patterned semiconductor wafer from a developer or rinse solution will generally result in a wetted surface sufficient to cover the photoresist layer, and thus a wetted surface removed from a liquid bath is deemed to be "immersed" within the context of the invention. Furthermore, only a portion of the photoresist area may be treated while wet, such as only those portions of an integrated circuit with high-density features, in which case only that portion of the photoresist may be immersed, with the rest of the surface area being treated while dry or semi-immersed.

Figure 5A:
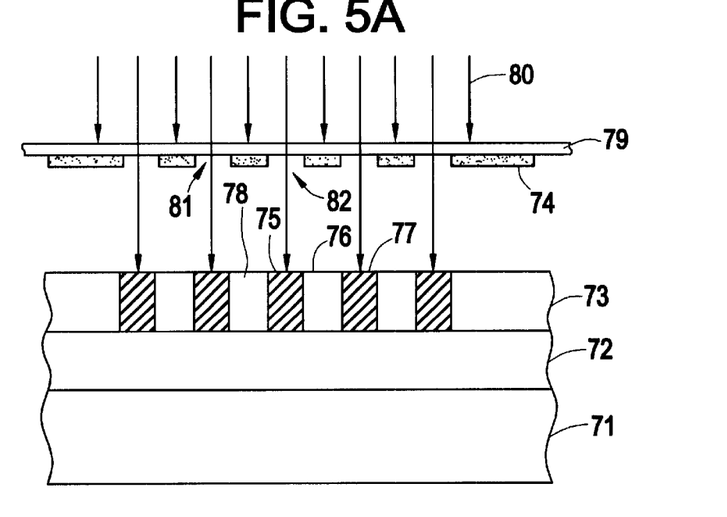
FIGS. 5A, 5B and 5C are side cross sectional views of a preferred embodiment method of making closely spaced narrow lines employing a positive photoresist.
Figure 5B:
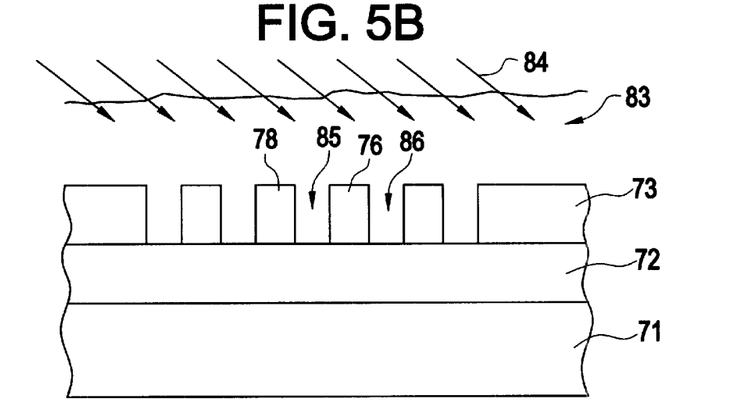
Figure 5C:
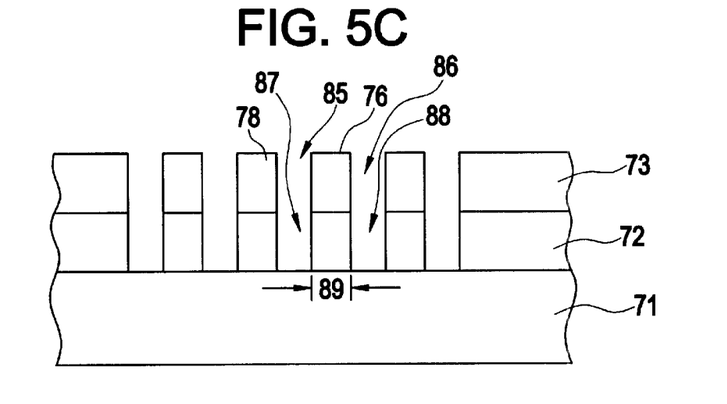

FIGS. 5A, 5B and 5C illustrate a method of forming narrow lines using a positive photoresist according to a preferred embodiment of the present invention. A positive photoresist layer 73 is formed over a surface 72 layered on a substrate 71. The photoresist layer 73 is then exposed to radiation 80, such as actinic light or other suitable UV radiation, through openings 81, 82 in the opaque pattern 74 in a mask or reticle 79 to form exposed regions 75, 77 in the photoresist layer 73, as illustrated in FIG. 5A. In this step, the exposed regions 75, 77 of the positive photoresist layer 73 are rendered soluble to developer solution. Other regions 76, 78 of the photoresist layer 73 are shielded by the opaque layer 74 of the mask 79 and are not exposed. The exposed photoresist regions 75, 77 are separated by a non-exposed region 76, which remains insoluble to the developer.

After the exposing step, the photoresist layer 73 is developed to remove the exposed photoresist regions 75, 77 from the unexposed regions 76, 78 to provide first and second openings 85, 86 to layer 73. Photoresist regions 76 and 78 are not removed during development and are used in subsequent steps to resist processes such as etching or implanting of the underlying surface 72.

After developing is complete, the remaining photoresist layer 73 is rinsed with rinse solution 83 to stop the developing reaction and remove developer solution. While the photoresist layer 73 remains immersed in the rinse solution 83, the photoresist material is treated to strengthen its material properties by inducing cross-linkages of the cross-linking components, as illustrated in FIG. 5B. This treatment may be illumination by ultraviolet light 84 and/or heating the surface to an elevated temperature for a certain amount of time. Once the photoresist material has been so strengthened, the surface is dried.

With openings 85 provided in the photoresist layer 73, narrow lines 87, 88 are formed in surface 72 by providing an etching gas or an etching liquid to the surface 72 through the openings 85 in the photoresist layer 73. Thus, narrow lines 87 and 88 separated by an inter-lines region 89 are formed in surface 72, as illustrated in FIG. 5C.

Figure 6A:
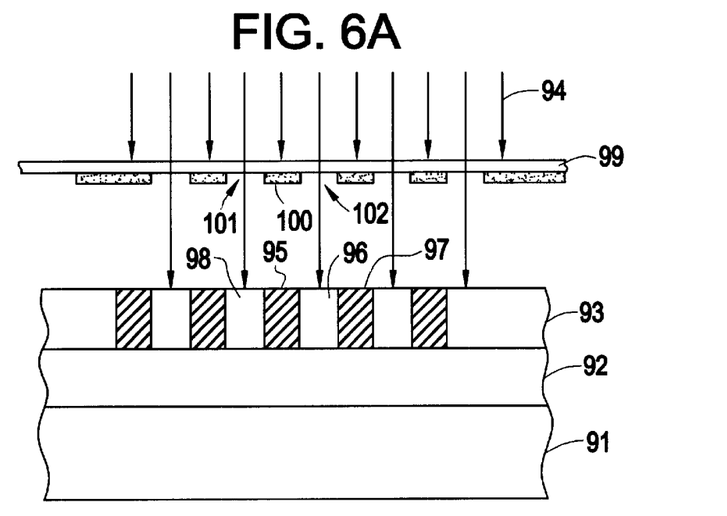
FIGS. 6A, 6B and 6C are side cross sectional views of a preferred embodiment method of making closely spaced narrow lines employing a negative photoresist.
Figure 6B:
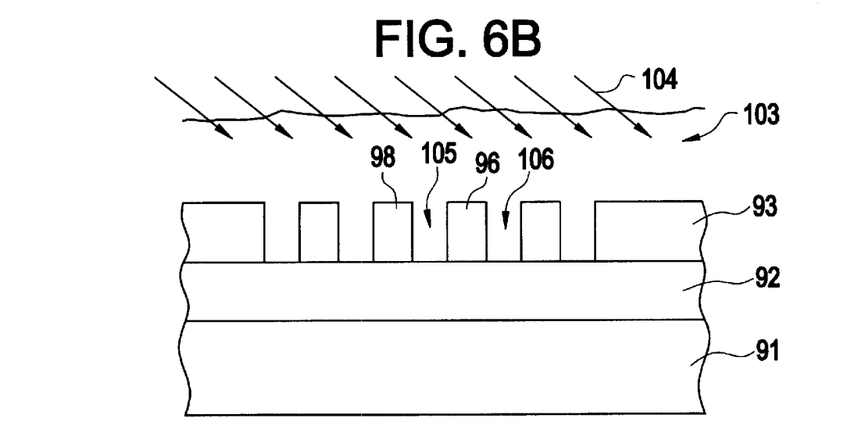
Figure 6C:
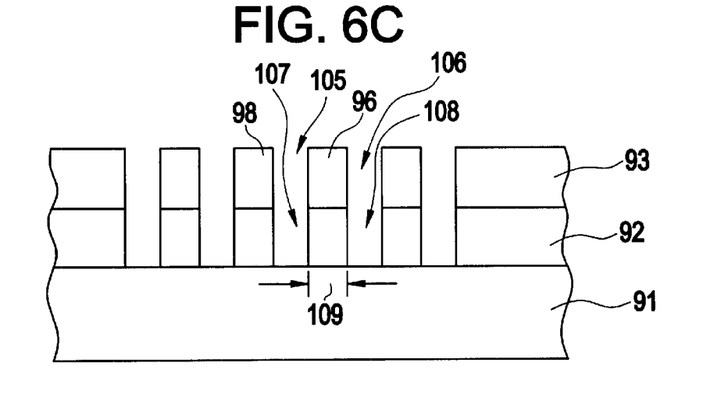

FIGS. 6A–6C illustrate a method of forming narrow lines using a negative photoresist according to another preferred embodiment of the present invention. A negative photoresist layer 93 is formed over a surface 92 that is layered on a substrate 91. The photoresist layer 93 is uncross-linked and is thus developer soluble. The photoresist layer 93 is then exposed to radiation 94, such as actinic light or other suitable UV radiation, through openings 101, 102 in a mask or reticle 99 to form exposed regions 96, 98 in the photoresist layer 93, as illustrated in FIG. 6A. The exposure to radiation 94 cross-links the photoresist in regions within the areas 96, 98, rendering regions within the areas 96, 98 insoluble to developer solution. Regions within the areas 95, 97 are not exposed because it is shielded by an opaque region 100 of the mask 99.

After the exposure step, the photoresist layer 93 is developed to remove the uncross-linked photoresist in the unexposed regions 95, 97 to provide first and second openings 105, 106 to surface 92. Photoresist regions 96 and 98 are not removed during development and are used in subsequent steps to resist etching of the underlying surface 92.

After developing is complete, the remaining photoresist layer 93 is rinsed with a rinse solution 103 to stop the developing reaction and remove developer solution. While the photoresist layer 93 remains immersed in the rinse solution 103, the photoresist material 93 is treated to strengthen its material properties by inducing cross-linkages of the cross-linking component, as illustrated in FIG. 6B. This treatment may be illumination by ultraviolet light 104 and/or heating the surface to an elevated temperature for a certain amount of time. Once the photoresist material has been so strengthened, the surface is dried.

With openings 105, 106 provided in the photoresist layer 93, narrow lines 107, 108 are formed in layer 92 by providing an etching gas or an etching liquid to the surface 92 through the openings 105, 106 in the photoresist layer 93, as illustrated in FIG. 6C. Thus, narrow lines 107 and 108 separated by an inter-lines region 109 are formed in surface 92, as shown in FIG. 6C.

While FIGS. 5A–5C and 6A–6C illustrate only a few narrow lines for ease of explanation, it should be understood that a semiconductor device contains a vast plurality of narrow lines.

The surface 72, 92, shown in the embodiments of FIGS. 5A–5C and 6A–6C respectively, containing the narrow lines may comprise any layer of material used in an electronic or semiconductor device, such as an insulating, metal or semiconductor layer. Preferably, surface 72, 92 comprises an insulating layer in a semiconductor device, such as a first level insulating layer or an intermetal dielectric.

Figure 7:
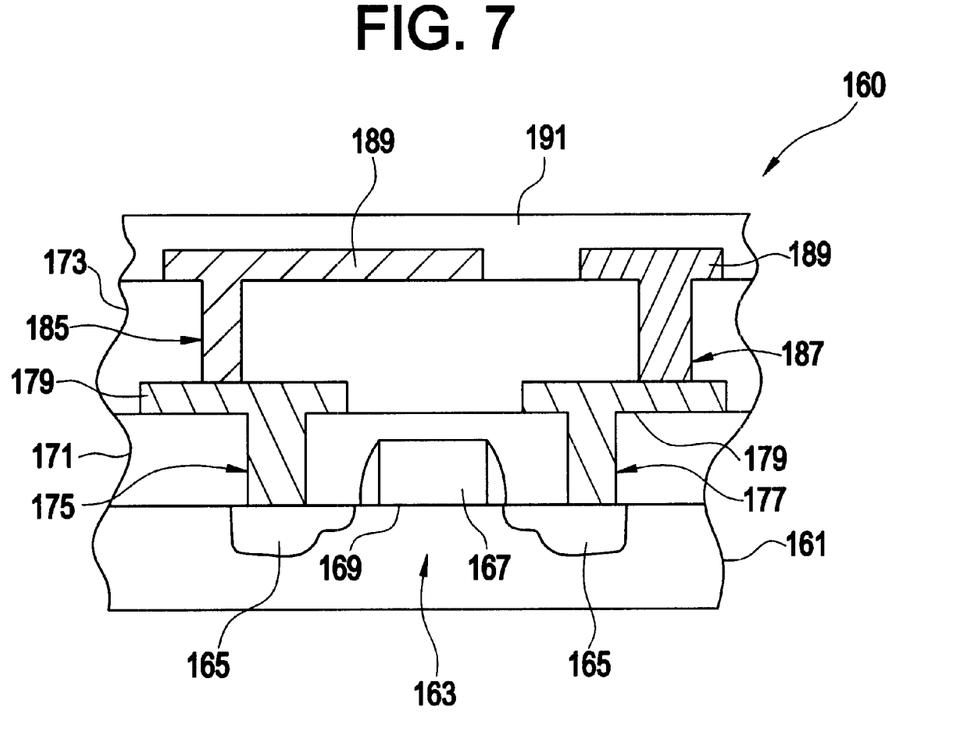
FIG. 7 is a partial side cross sectional view of a completed semiconductor device made by the method of the preferred embodiments of the present invention.

FIG. 7 illustrates a completed semiconductor device 160 containing the narrow lines made by the methods of a preferred embodiment. The semiconductor device 160 contains a substrate 161, which may be a semiconductor (such as silicon or gallium arsenide, etc.), a glass or a plastic material. One or more active elements 163 are formed on the substrate 161. The active element may comprise at least one of a MOSFET, a MESFET, a bipolar transistor, a capacitor, a resistor or any other desired device. For example, FIG. 7 illustrates a MOSFET 163.

The MOSFET 163 contains doped source and drain regions 165 in the substrate 161, a gate electrode 167 with sidewall spacers and a gate dielectric 169 between the gate electrode and the channel region in the substrate 161. At least one insulating layer overlies the active element 163. For example, the at least one insulating layer includes a first level insulating layer 171 and a first intermetal dielectric 173, as illustrated in FIG. 7. It should be understood that there may be other plural intermetal dielectric layers above layer 173 that contain narrow lines. The insulating layers 171, 173 may comprise any dielectric layer, such as at least one of silicon oxide, silicon nitride, silicon oxynitride, fluorinated silicon oxide, aluminum oxide, tantalum oxide, BPSG, PSG, BSG or spin on glass. It should be noted that the insulating layers 171, 173 may comprise plural sublayers of different dielectric materials, if desired.

The first level insulating layer 171 contains a first narrow line 175 and a second narrow line 177 formed using a preferred embodiment method. Conductive electrodes 179 are formed in the narrow lines 175 and 177. The narrow lines 175, 177 extend to the active device 163, such that the electrodes 179 contact the source and drain regions 165. The electrode material may be selected from at least one of polysilicon, aluminum, copper, tungsten, titanium, titanium nitride br metal silicide.

The first intermetal dielectric layer 173 contains a first narrow line 185 and a second narrow line 187 formed using a preferred embodiment method. Conductive first level interconnect metallization layers 189 are formed in the narrow lines 185 and 187. The narrow lines 185, 187 extend to the electrodes 179, such that the metallization layers 189 contact the electrodes 179. The metallization 189 material may be selected from at least one of polysilicon, aluminum, copper, tungsten, titanium, titanium nitride or metal silicide. A second level intermetal dielectric layer 191 overlies metallization layer 189.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

What is claimed is:

1. A method of forming a photoresist layer, comprising the steps of:

providing a surface;

depositing a photoresist layer on the surface, the photoresist layer having material properties and comprising a matrix material, a photoactivated sensitizer material that is sensitized when exposed to radiation of a first wavelength, a solvent material, and a cross-linkable material capable of forming cross-links when exposed to radiation of a second wavelength in an ultraviolet range and different than the first wavelength;

exposing the photoresist layer to radiation of the first wavelength through a mask to create an exposed area of photoresist and an unexposed area of photoresist;

developing the photoresist layer to remove the exposed area of the photoresist; and exposing the photoresist layer to radiation of the second wavelength while the photoresist layer is immersed in a liquid to change the material properties.

2. The method of claim 1, further comprising a step of rinsing the photoresist layer in a rinse solution before the step of exposing the photoresist layer to radiation of the second wavelength, and wherein said liquid includes the rinse solution.

3. The method of claim 1, wherein the step of exposing the photoresist layer to radiation of the second wavelength further comprises heating the photoresist layer.

4. The method of claim 3, wherein heating the photoresist layer is accomplished by irradiating the photoresist layer with infrared radiation while simultaneously exposing the photoresist layer to radiation of the second wavelength.

5. The method of claim 3, wherein heating the photoresist layer is accomplished by heating the surface.

6. The method of claim 3, wherein heating the photoresist layer is accomplished by heating the developer solution.

7. The method of claim 1, wherein the step of exposing the photoresist layers to radiation of the second wavelength accomplished by heating the liquid.

8. A method of making a semiconductor device, comprising the steps of:

forming at least one semiconductor device on a substrate;

forming an insulating layer over the semiconductor device;

forming a photoresist layer over the insulating layer, the photoresist layer having material properties and comprising a matrix material, a photoactivated sensitizer material that is sensitized when exposed to radiation of a first wavelength, a solvent material, and a cross-linkable material capable of forming cross-links when exposed to radiation of a second wavelength in an ultraviolet range and which is different that the first wavelength;

exposing the photoresist layer to radiation of the first wavelength through a mask to create an exposed area of photoresist and an unexposed area of photoresist;

developing the photoresist layer to form an opening in the photoresist layer by removing the exposed area of photoresist;

exposing the photoresist layer to radiation of the second wavelength while the photoresist layer is immersed in a liquid to change the material properties;

forming a narrow line in the insulating layer; and forming a conductive layer in the narrow line.

9. The method of claim 8, wherein the developing step comprises immersing the photoresist layer in a developer solution, and further comprising a step of rinsing the photoresist layer in a rinse solution to remove the developer solution before the step of exposing the photoresist layer to radiation of the second wavelength, and wherein said liquid includes the rinse solution.

10. The method of claim 8, wherein the step of exposing the photoresist layer to radiation of the second wavelength further comprises heating the photoresist layer.

11. The method of claim 10, wherein heating the photoresist layer is accomplished by irradiating the photoresist layer with infrared radiation while simultaneously exposing the photoresist layer to radiation of the second wavelength.

12. The method of claim 10, wherein heating the photoresist layer is accomplished by heating the insulating layer.

13. The method of claim 10, wherein heating the photoresist layer is accomplished by heating the liquid.

14. The method of claim 8, wherein the narrow line extends to the at least one semiconductor device or to a second conductive layer above the at least one semiconductor device.

15. A method of making a device, comprising the steps of:

providing a surface of the device;

depositing a photoresist layer on the surface, the photoresist layer comprising a matrix material, a photoactivated sensitizer material that is sensitized when exposed to radiation of a first wavelength, a solvent material, and a cross-linkable material capable of forming cross-links when exposed to radiation of a second wavelength in an ultraviolet range and which is different than the first wavelength;

exposing the photoresist layer to radiation of the first wavelength through a mask to create a sensitized area of photoresist and an unsensitized area of photoresist;

developing the photoresist layer to remove a portion of the photoresist;

exposing the developed photoresist layer to radiation of the second wavelength while the photoresist layer is immersed in a liquid to form cross-links in the cross-linkable material; and patterning the surface of the device after the step of exposing the developed photoresist layer to radiation of the second wavelength using the developed photoresist layer as a mask.

16. The method of making a device according to claim 15, wherein the device is a semiconductor device.

17. The method of making a device according to claim 15, wherein the portion of the photoresist layer removed in the developing step is the sensitized area of photoresist.

18. The method of making a device according to claim 15, wherein the portion of the photoresist layer removed in the developing step is the unsensitized area of photo resist.

19. The method of making a device according to claim 15, wherein the cross-linkable material is insensitive to radiation of the first wavelength.

\* \* \* \* \*